(12) United States Patent
Yang et al.

(10) Patent No.: US 11,024,553 B2
(45) Date of Patent: Jun. 1, 2021

(54) SEMICONDUCTOR STRUCTURE AND MANUFACTURING METHOD THEREOF

(71) Applicant: NANYA TECHNOLOGY CORPORATION, New Taipei (TW)

(72) Inventors: Tsang-Po Yang, New Taipei (TW); Jui-Hsiu Jao, Taoyuan (TW); Chun-Shun Huang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/031,870

(22) Filed: Sep. 24, 2020

(65) Prior Publication Data
US 2021/0020527 A1 Jan. 21, 2021

Related U.S. Application Data

(62) Division of application No. 16/136,274, filed on Sep. 20, 2018, now Pat. No. 10,825,744.

(51) Int. Cl.
*H01L 29/78* (2006.01)
*H01L 21/66* (2006.01)
*H01L 23/60* (2006.01)
*H01L 23/522* (2006.01)

(52) U.S. Cl.
CPC .............. *H01L 22/34* (2013.01); *H01L 22/12* (2013.01); *H01L 22/14* (2013.01); *H01L 23/5226* (2013.01); *H01L 23/5228* (2013.01); *H01L 23/60* (2013.01); *H01L 29/783* (2013.01)

(58) Field of Classification Search
CPC ......... H01L 22/12; H01L 22/14; H01L 22/32; H01L 22/34; H01L 29/78; H01L 29/783; H01L 27/06; H01L 27/0629; H01L 23/60; H01L 23/522; H01L 23/5226; H01L 23/5228
USPC .......................................................... 438/197
See application file for complete search history.

(56) References Cited

U.S. PATENT DOCUMENTS

| | | | |
|---|---|---|---|
| 9,431,518 B2 * | 8/2016 | Nyhus | H01L 21/28123 |
| 2011/0221421 A1 | 9/2011 | Williams | |
| 2014/0159118 A1 | 6/2014 | Lenci et al. | |
| 2017/0084754 A1 * | 3/2017 | Shionoiri | H01L 23/49513 |

* cited by examiner

*Primary Examiner* — Chuong A Luu
(74) *Attorney, Agent, or Firm* — CKC & Partners Co., LLC

(57) ABSTRACT

A method includes forming a transistor over a substrate; forming a conductive structure over the substrate, such that a first end of the conductive structure is electrically coupled to a gate of the transistor, and a second end of the conductive structure is electrically coupled to the substrate; applying biases to the gate of the transistor and source/drain structures of the transistor; determining whether the first end and the second end of the conductive structure are electrically connected; generating, based on the determination, a first result indicating that the first end and the second end of the conductive structure are electrically connected; and qualifying the conductive structure as an antenna in response to the first result.

7 Claims, 16 Drawing Sheets

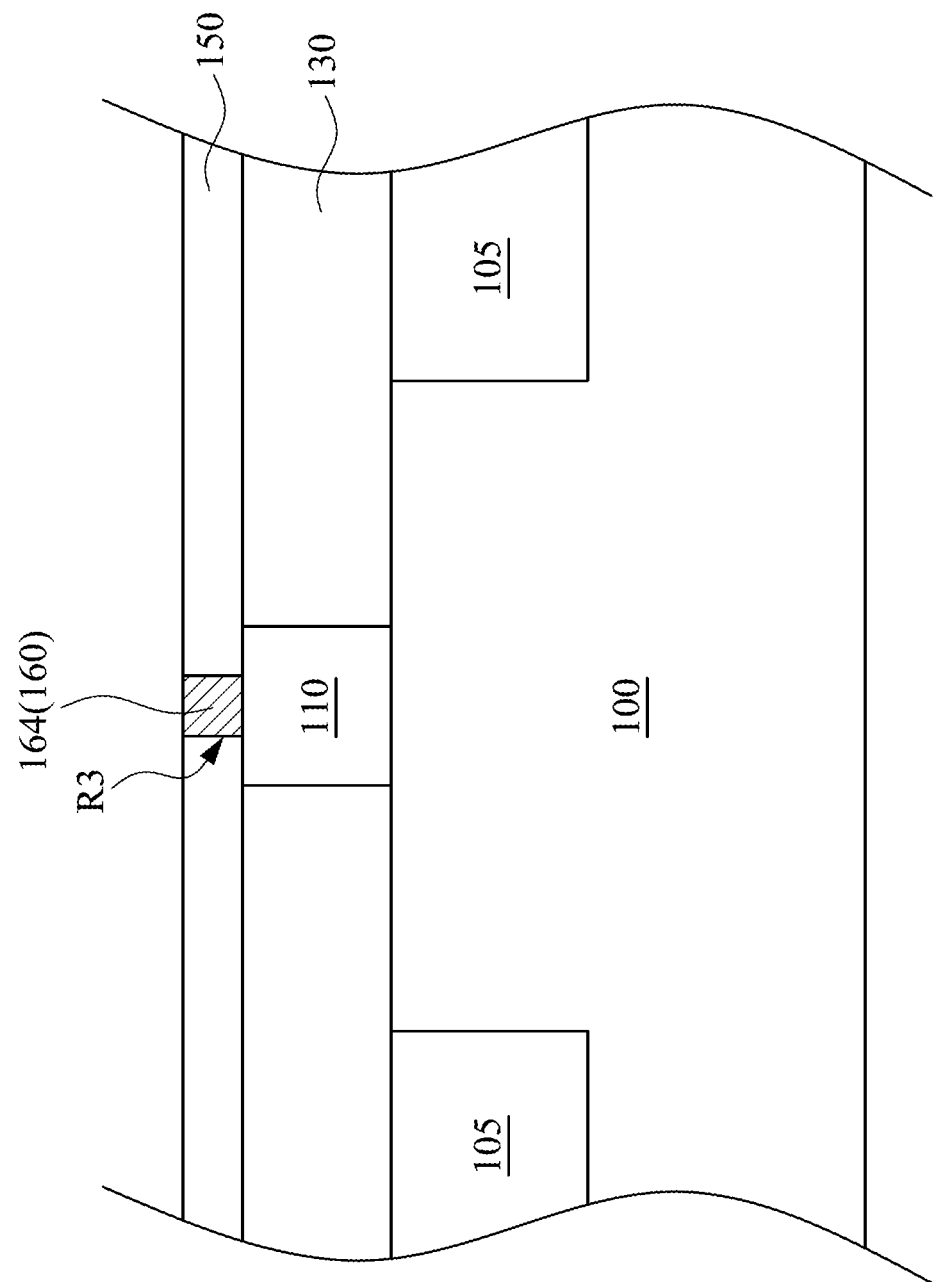

SEMICONDUCTOR STRUCTURE AND MANUFACTURING METHOD THEREOF

CROSS-REFERENCE TO RELATED APPLICATION

The present application is a Divisional application of U.S. application Ser. No. 16/136,274, filed on Sep. 20, 2018, which is herein incorporated by reference.

BACKGROUND

Field of Invention

The present invention relates to a semiconductor structure.

Description of Related Art

Generally, a plurality of integrated circuit chips are formed on a semiconductor substrate (wafer) by performing semiconductor thin film processes having peculiar properties. Following formation of the integrated circuit chips, the wafer is sawed for individualizing them. Thus, a vacant space exists between integrated circuit chips. Namely, a vacant space for sawing the wafer is formed between the integrated circuit chips. The vacant space is called a scribe line area. Elements constituting an integrated circuit chip are not formed at the scribe line area.

To assess electric properties of elements constituting an integrated circuit chip, a predetermined pattern of measuring elements or test elements (so-called test element group (TEG)) is formed on a scribe line area of a semiconductor wafer. The TEG is electrically tested for determining whether elements are suitably formed in integrated circuit chips formed on the wafer.

Since the TEG is formed using the same process as a process for forming elements in integrated circuit chips, testing electric properties of the TEG is identical to testing electric properties of the elements formed in the integrated circuit chips. Accordingly, the properties of the integrated circuit chips can be correctly deduced by testing the TEG. Once the properties have been tested, there remains no reason to retain the TEG. So the TEG can be formed in a sacrificial area of the wafer. Hence, the TEG is disposed in a scribe line area of the wafer to prevent a decrease in the number of integrated circuit chips that otherwise could be produced from the wafer.

SUMMARY

In some embodiments of the present disclosure, a method includes forming a transistor over a substrate; forming a conductive structure over the substrate, such that a first end of the conductive structure is electrically coupled to a gate of the transistor, and a second end of the conductive structure is electrically coupled to the substrate; applying biases to the gate of the transistor and source/drain structures of the transistor; determining whether the first end and the second end of the conductive structure are electrically connected; generating, based on the determination, a first result indicating that the first end and the second end of the conductive structure are electrically connected; and qualifiying the conductive structure as an antenna in response to the first result.

According to some embodiments, the transistor and the conductive structure are formed on a test element group (TEG) of the substrate.

According to some embodiments, the method further includes generating, based on the determination, a second result indicating that the first and the second end of the conductive structure are not electrically connected; measuring an area of a portion of the conductive structure that is electrically connected to the gate in response to the second result; and determining whether a ratio of the measured area of the portion of the conductive structure to an area of the gate is within a safe range.

According to some embodiments, measuring the area of the portion of the conductive structure includes generating an image of the conductive structure using an electronic scanning technology.

According to some embodiments, forming the conductive structure is performed such that the conductive structure has a serpentine shape.

According to some embodiments, forming the conductive structure is performed such that the conductive structure has a first portion and a second portion collectively forming a shape of interlocking combs, the first portion is connected to the first end, and the second portion is connected to the second end.

According to some embodiments, the method further includes forming a via connecting the conductive structure to the substrate.

In some embodiments of the present disclosure, a semiconductor structure includes a substrate, a gate stack over the substrate, and a conductive structure over the gate stack. The substrate includes source/drain regions at opposite sides of the gate stack. A first end of the conductive structure is coupled to the gate stack, and a second end of the conductive structure is coupled to the substrate, and the conductive structure has a portion in a shape of a serpentine pattern or in a shape of interlocking combs.

According to some embodiments, the portion of the conductive structure in the shape of interlocking combs has a first comb-shaped portion and a second comb-shaped portion opposite each other, and first and second comb-shaped portions are separated from each other.

According to some embodiments, the portion of the conductive structure in the shape of interlocking combs has a first comb-shaped portion and a second comb-shaped portion opposite each other, and first and second comb-shaped portions are in contact with each other.

According to some embodiments, the portion of the conductive structure in the shape of the serpentine pattern is continuous.

According to some embodiments, the portion of the conductive structure in the shape of the serpentine pattern is discontinuous.

According to some embodiments, the semiconductor structure further includes a first via connects the second end of the conductive structure to the substrate.

According to some embodiments, the semiconductor structure further includes a first interlayer dielectric (ILD) layer surrounds the gate stack and a second ILD layer between the first ILD layer and the conductive structure, wherein the via penetrates through the first ILD layer and the second ILD layer.

According to some embodiments, the semiconductor structure further includes a second via connecting the first end of the conductive structure to the gate stack, and the second via is disposed between the second ILD layer.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1A:
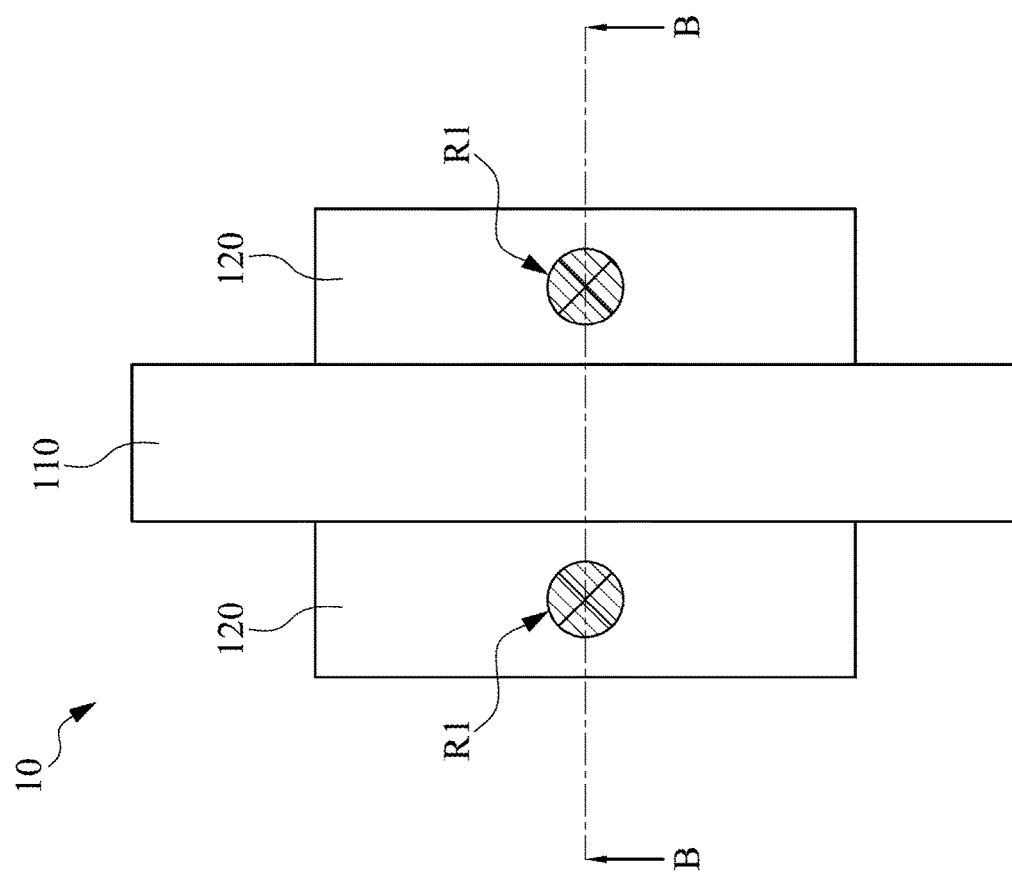
FIGS. 1A to 3D illustrate a semiconductor structure at various stages in accordance with some embodiments of the present disclosure.

Reference will now be made in detail to the present embodiments of the invention, examples of which are illustrated in the accompanying drawings. Wherever possible, the same reference numbers are used in the drawings and the description to refer to the same or like parts.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1A to 3D illustrate a semiconductor structure at various stages in accordance with some embodiments of the present disclosure.

Figure 1B:
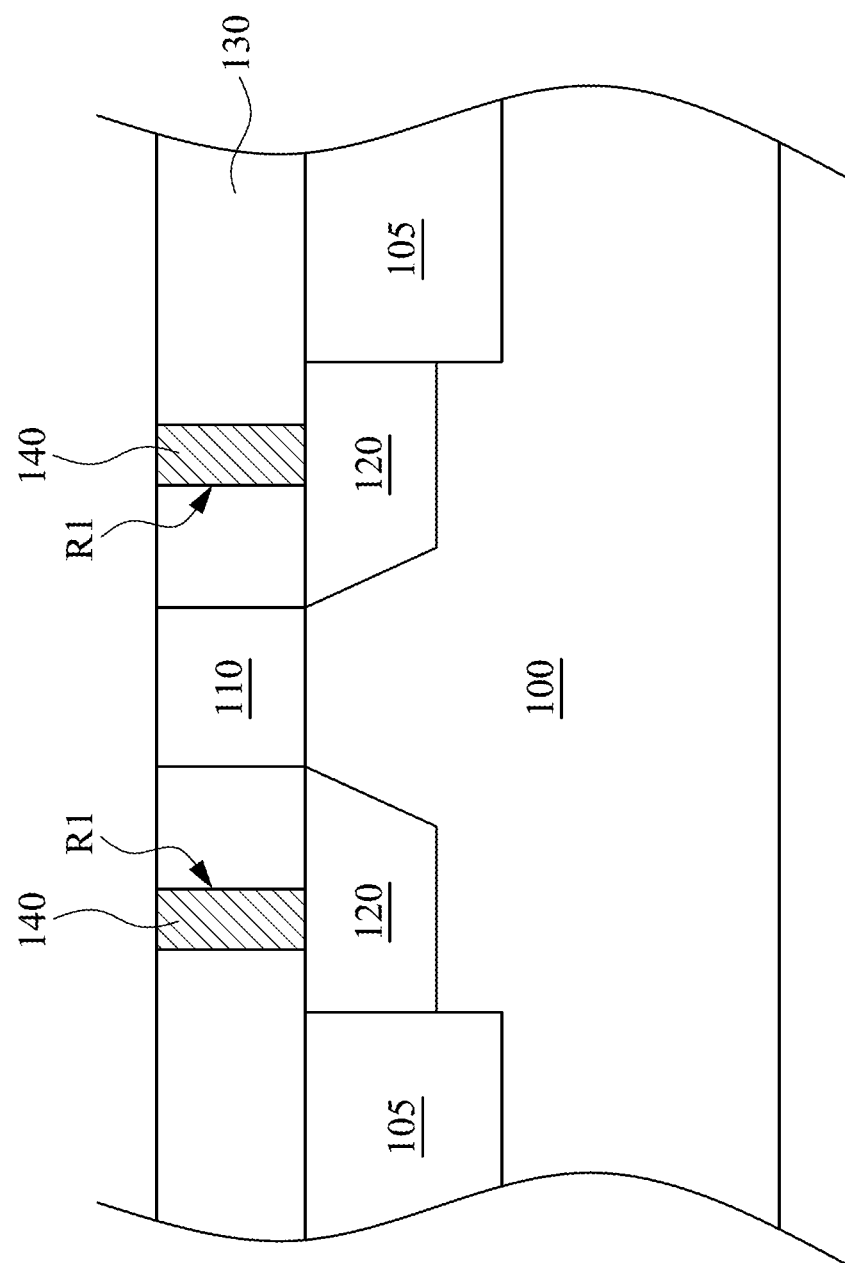

Reference is made to FIGS. 1A and 1B, where FIG. 1A is a top view of a semiconductor structure, and FIG. 1B is a cross-sectional view along line B-B of FIG. 1A. It is noted that some elements of FIG. 1B are not illustrated in FIG. 1A for clarity.

It is understood that the structures described in the following discussion may be formed on a test element group (TEG) of the wafer. Here, the TEG is formed on a scribe line area of a semiconductor wafer that can be used to determine whether elements formed thereon are suitably formed in integrated circuit chips on the wafer. Accordingly, the properties of the integrated circuit chips can be correctly deduced by testing the TEG. Once the properties have been tested, there remains no reason to retain the TEG. So the TEG can be formed in a sacrificial area of the wafer. Hence, the TEG is disposed in a scribe line area of the wafer to prevent a decrease in the number of integrated circuit chips that otherwise could be produced from the wafer.

A transistor 10 is formed over a substrate 100, where the transistor 10 includes a gate stack 110 and source/drain structures 120 disposed at opposite sides of the gate stack 110. In some embodiments, the transistor 10 is formed on a TEG of the substrate 100, but the present disclosure is not limited thereto. In some embodiments, the gate stack 110 may be formed by blanket a gate material layer over the substrate, and the material layer is then patterned to form the gate stack 110. Then, the substrate 100 may undergo an implantation process to form the source/drain structures 120 by implanting dopants to portions of the substrate 100 that are exposed from the gate stack 110. In some embodiments, the source/drain structures 120 may include P-type or N-type dopants. In one embodiment, the source/drain structures 120 may be P-doped when the surrounding region of the substrate 100 is an N-well region. In another embodiment, source/drain structures 120 may be N-doped when the surrounding region of the substrate 100 is a P-well region. It is noted that the substrate 100 is not illustrated in FIG. 1A for clarity.

In some embodiments, the substrate 100 may be a semiconductor substrate such as a silicon substrate. In some embodiments, the substrate 100 may include various layers, including conductive or insulating layers formed on a semiconductor substrate. In some embodiments, different doping profiles (e.g., n wells, p wells) may be formed on the substrate 100 and are designed for different device types (e.g., n-type field effect transistors (NFET), p-type field effect transistors (PFET)). The suitable doping may include ion implantation of dopants and/or diffusion processes. In some embodiments, the substrate 100 may also include other semiconductors such as germanium, silicon carbide (SiC), silicon germanium (SiGe), or diamond. In some embodiments, the substrate 100 may include a compound semiconductor and/or an alloy semiconductor. In some embodiments, the substrate 100 may optionally include an epitaxial layer (epi-layer), may be strained for performance enhancement, may include a silicon-on-insulator (SOI) structure, and/or have other suitable enhancement features.

Plural isolation structures 105 may also be formed on the substrate 100 prior to the gate stack 110 and the source/drain structures 120, so as to isolate different device regions over the substrate 100. In some embodiments, the isolation structures 105 may be formed by, for example, etching the substrate 100 to form plural trenches that define the position of the isolation structures 105, and trenches are filled with dielectric material to form isolation structures 105. The isolation structures 105 can be referred to as shallow trench isolation (STI) features. In some embodiments, the isolation structures 105 may include SiO2, Si3N4, SiOxNy, fluorine-doped silicate glass (FSG), a low-k dielectric, combinations thereof, and/or other suitable materials. In some embodiments, the isolation structures 105 may be deposited by a CVD process, a subatmospheric CVD (SACVD) process, a flowable CVD process, an ALD process, a PVD process, and/or other suitable process. In some embodiments, after deposition of the isolation structures 105, an annealing process can be performed, for example, to improve the quality of the isolation structures 105. In some embodiments, the isolation structures 105 may include a multi-layer structure, for example, having one or more liner layers. It is noted that the isolation structures 105 is not illustrated in FIG. 1A for clarity.

In some embodiments, the source/drain structures 120 may include epitaxially material. For example, the substrate 100 may be partially removed to form trenches therein, and semiconductor material may be epitaxially formed in the trenches to form the source/drain structures 120. Thus, in some embodiments, the source/drain structures 120 may also be referred to as epitaxial structures 120.

An interlayer dielectric (ILD) layer 130 is formed over the substrate 100 and surrounds the gate stack 110. In some embodiments, the ILD layer 130 may be formed by blanketing a dielectric layer over the substrate 100. Then, a planarization process, such as CMP, may be performed to remove the excessive dielectric layer until the top surface of the gate stack 110 is exposed. In some embodiments, the ILD layer 130 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 130 may be deposited by a PECVD process or other suitable deposition technique.

Source/drain contacts 140 are formed in the ILD layer 130 to interconnect respectively with the source/drain structures 120. In some embodiments, the source/drain contacts 140 may be formed by patterning the ILD layer 130 to form plural recesses R1 that define the positions of the source/drain contacts 140. Then, a conductive material is formed over the substrate 100 and filling the recesses R1. Planarization process, such as CMP, may be performed to remove the excessive conductive material until the top surface of the gate stack 110 is exposed. Accordingly, top surfaces of the gate stack 110, the ILD layer 130, and the source/drain contacts 140 are substantially coplanar. It is noted that the ILD layer 130 is not illustrated in FIG. 1A for clarity.

Figure 2A:
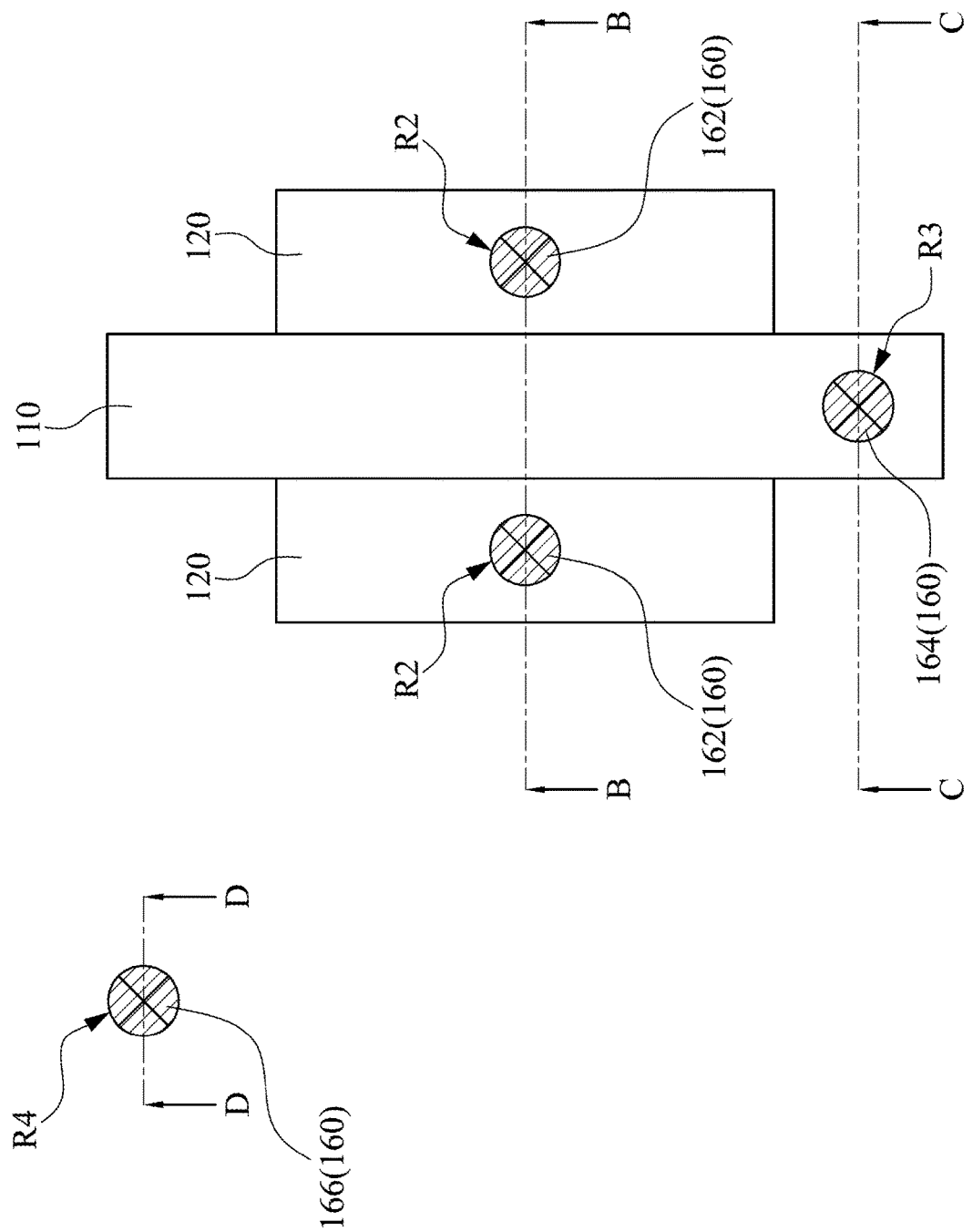
Figure 2B:
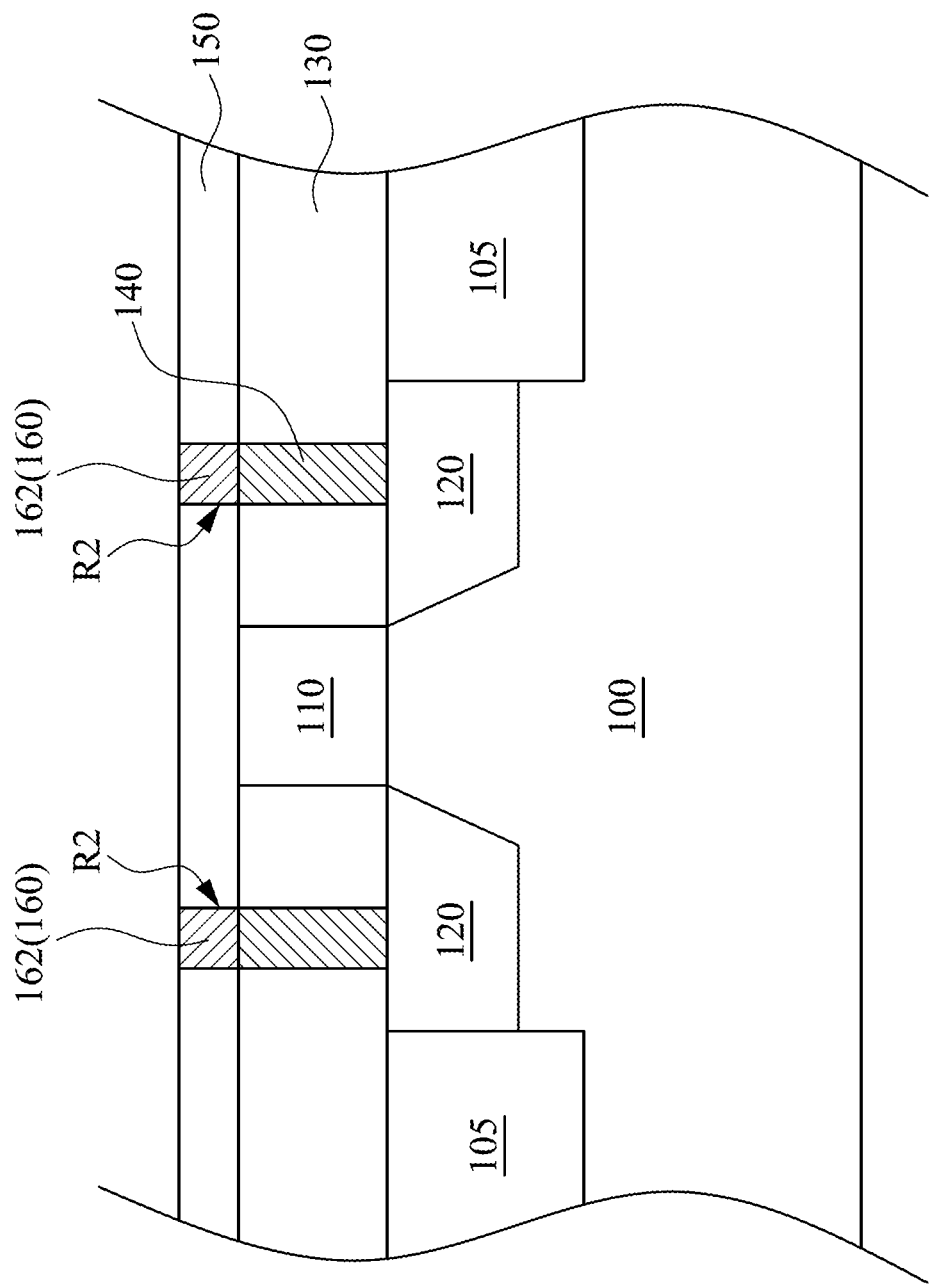
Figure 2D:
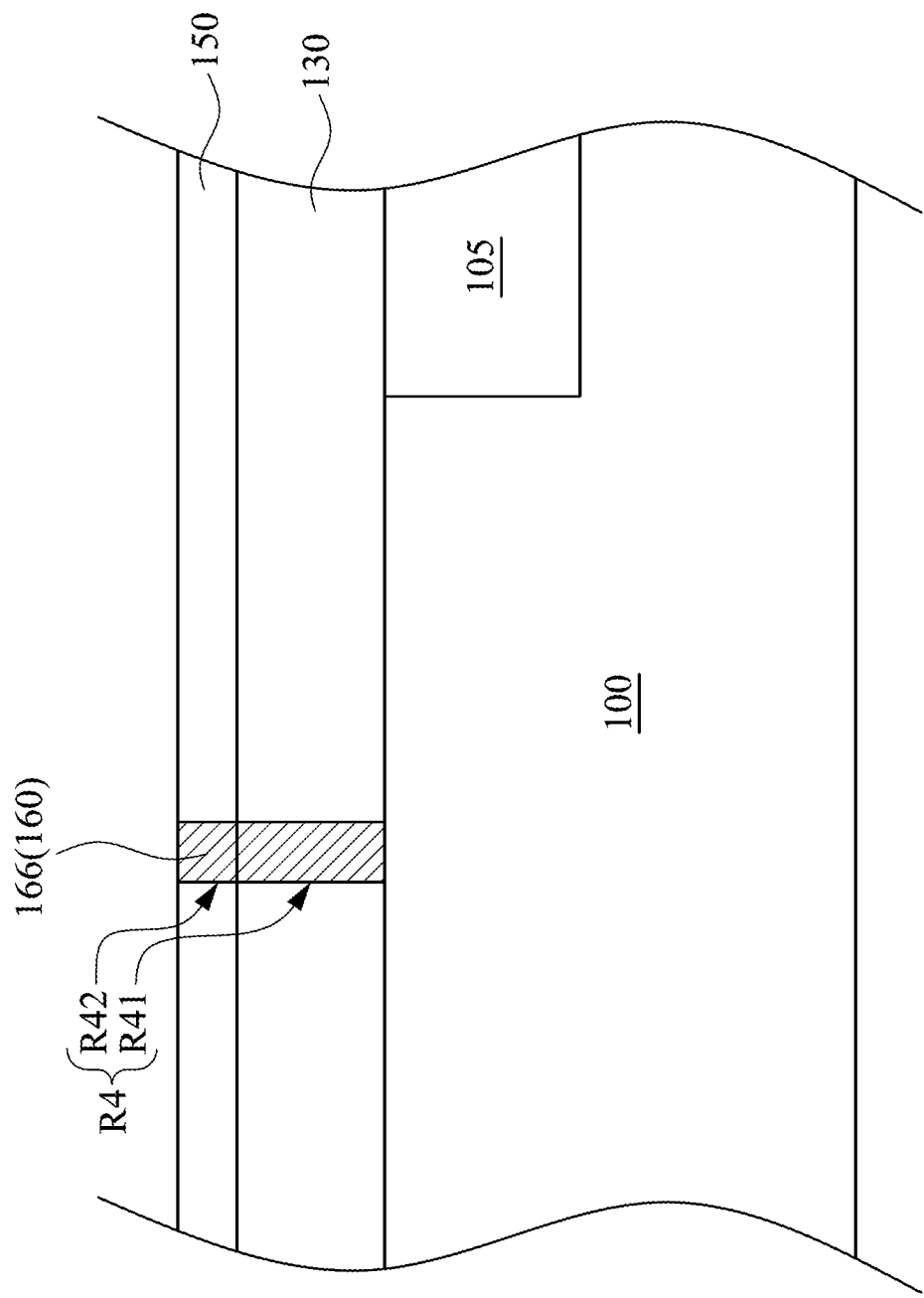

Reference is made to FIGS. 2A to 2D, where FIG. 2A is a top view of a semiconductor structure, FIG. 2B is a cross-sectional view along line B-B of FIG. 2A, FIG. 2C is cross-sectional view along line C-C of FIG. 2A, and FIG. 2D is cross-sectional view along line D-D of FIG. 2A. It is noted that some elements of FIGS. 2B to 2D are not illustrated in FIG. 2A for clarity.

An ILD layer 150 is formed over substrate 100 to cover the gate stack 110 and the ILD layer 130. In some embodiments, the ILD layer 150 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 150 may be deposited by a PECVD process or other suitable deposition technique. The ILD layer 130 and the ILD layer 150 can be made of the same material or different materials.

Then, the ILD layer 150 is patterned to form a plurality of recesses R2, R3, and R4. The recesses R2 expose the source/drain contacts 140, the recess R3 exposes the gate stack 110, and the recess R4 exposes the substrate 100. In some embodiments, the recesses R2 to R4 can be formed by depositing a mask layer over the ILD layer 150, where the mask layer is patterned to define the positions of the recesses R2 to R4. Then, an etching process is performed to etch the ILD layer 150 to form the recesses R2 to R4. During the etching process, the etchant of the etching process may etch through the ILD layer 150 and stop at the gate stack 110 and the source/drain contacts 140 to form the recesses R2 and R3, since the gate stack 110 and the source/drain contacts 140 have sufficient etching selectivities to the ILD layer 150. In contrast, the etchant of the etching process may etch through the ILD layers 130 and 150 and stop at the substrate 100 to form the recess R4, since the ILD layers 130 has less etching selectivity to the ILD layer 150. In greater detail, the recess R4 has a lower portion R41 and an upper portion R42 in communicated, where the lower portion R41 is between the ILD layer 130 and the upper portion R42 is between the ILD layer 150. It is noted that the ILD layer 150 is not illustrated in FIG. 3A for clarity.

A plurality of conductive vias 160 are formed respectively in the recesses R2 to R4. In some embodiments, the conductive vias 160 may be formed by depositing a conductive layer over the ILD layer 150 and filling the recesses R2 to R4. Then, a planarization process, such as CMP, is performed to remove excessive conductive layer to form the conductive vias 160. In greater detail, the conductive vias 160 include vias 162, 164, and 166, where the vias 162 are connected to the source/drain contacts 140, the via 164 is connected to the gate stack 110, and the via 166 is connected to the substrate 100.

Figure 3A:
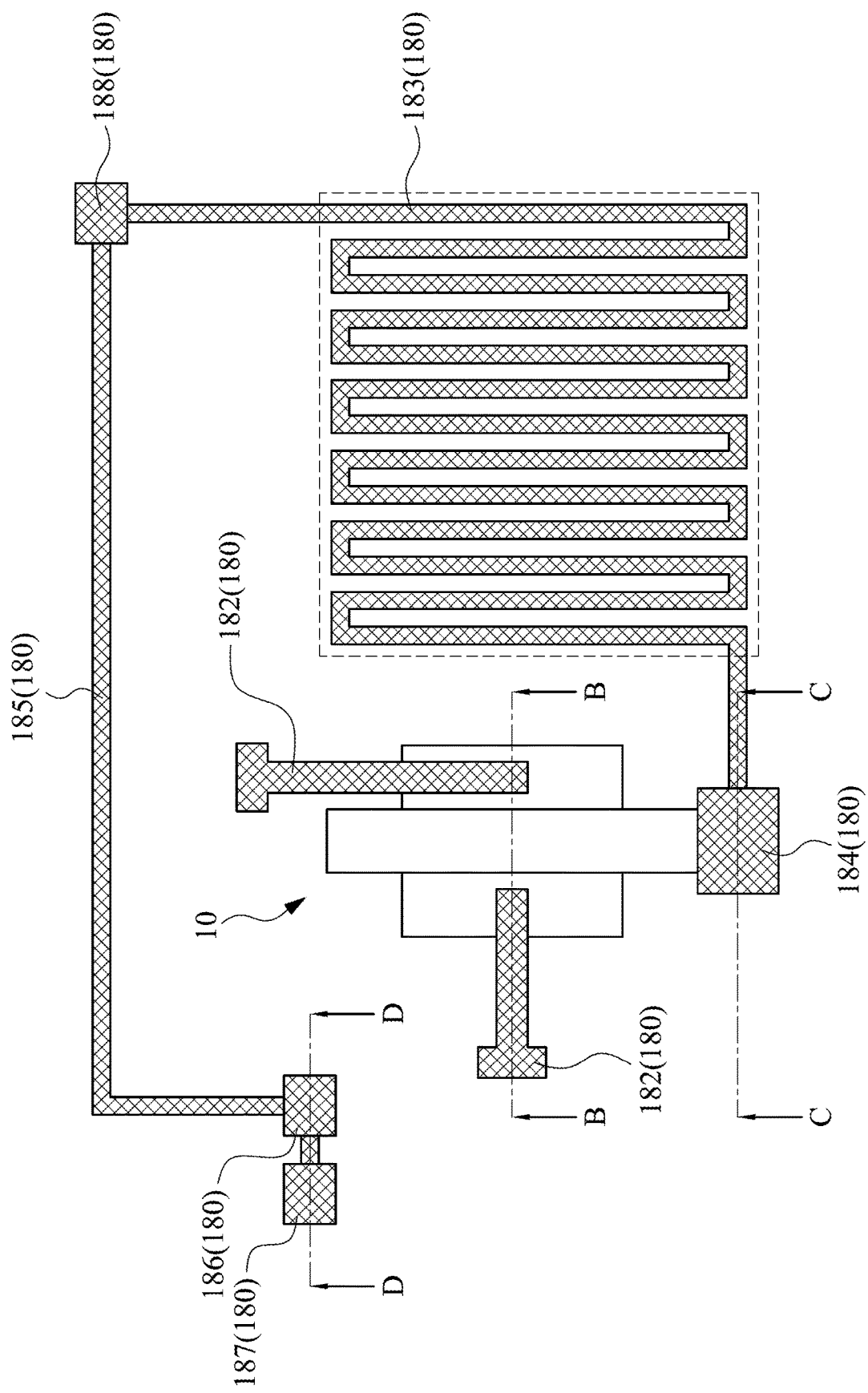
Figure 3B:
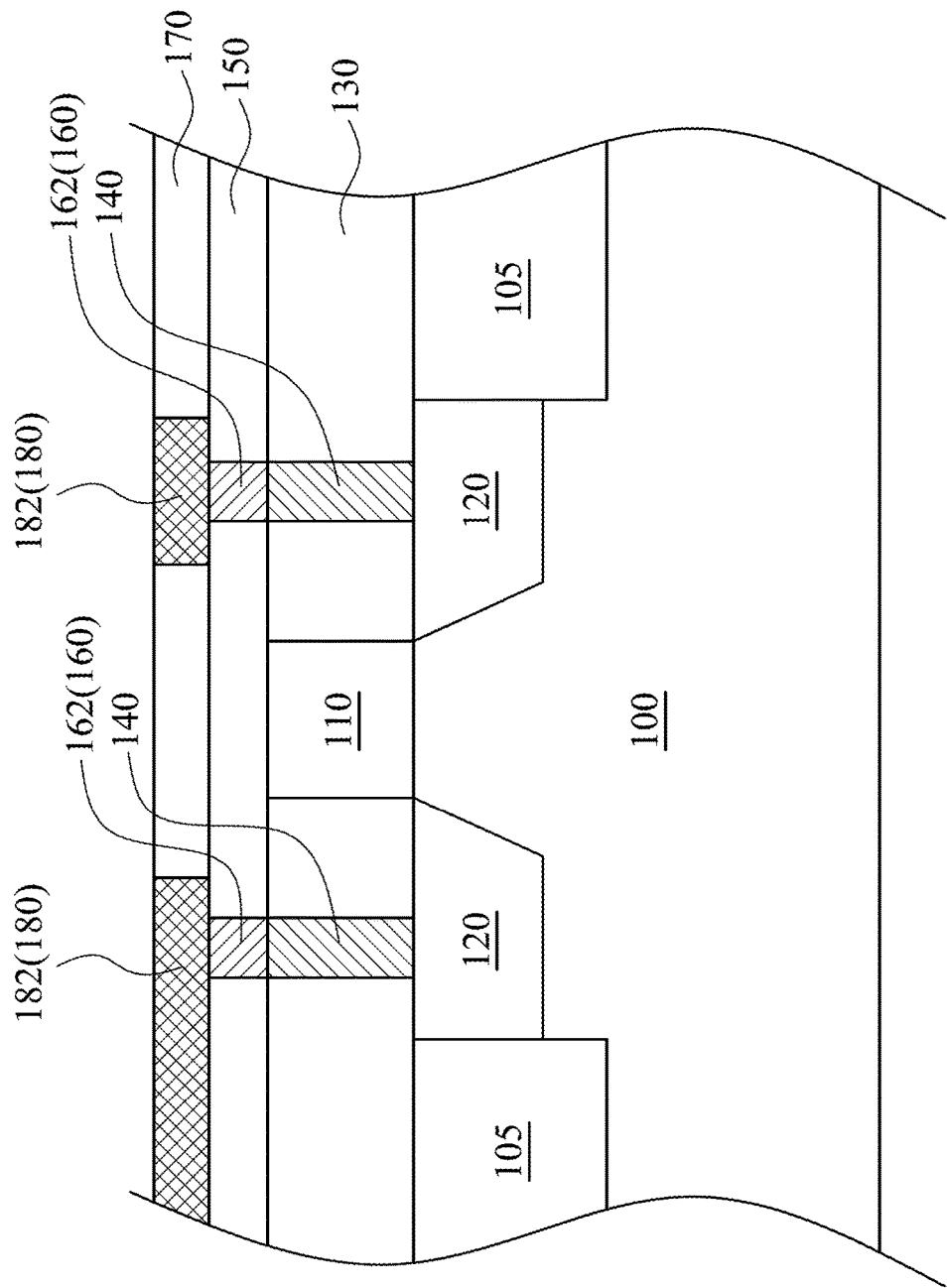
Figure 3C:
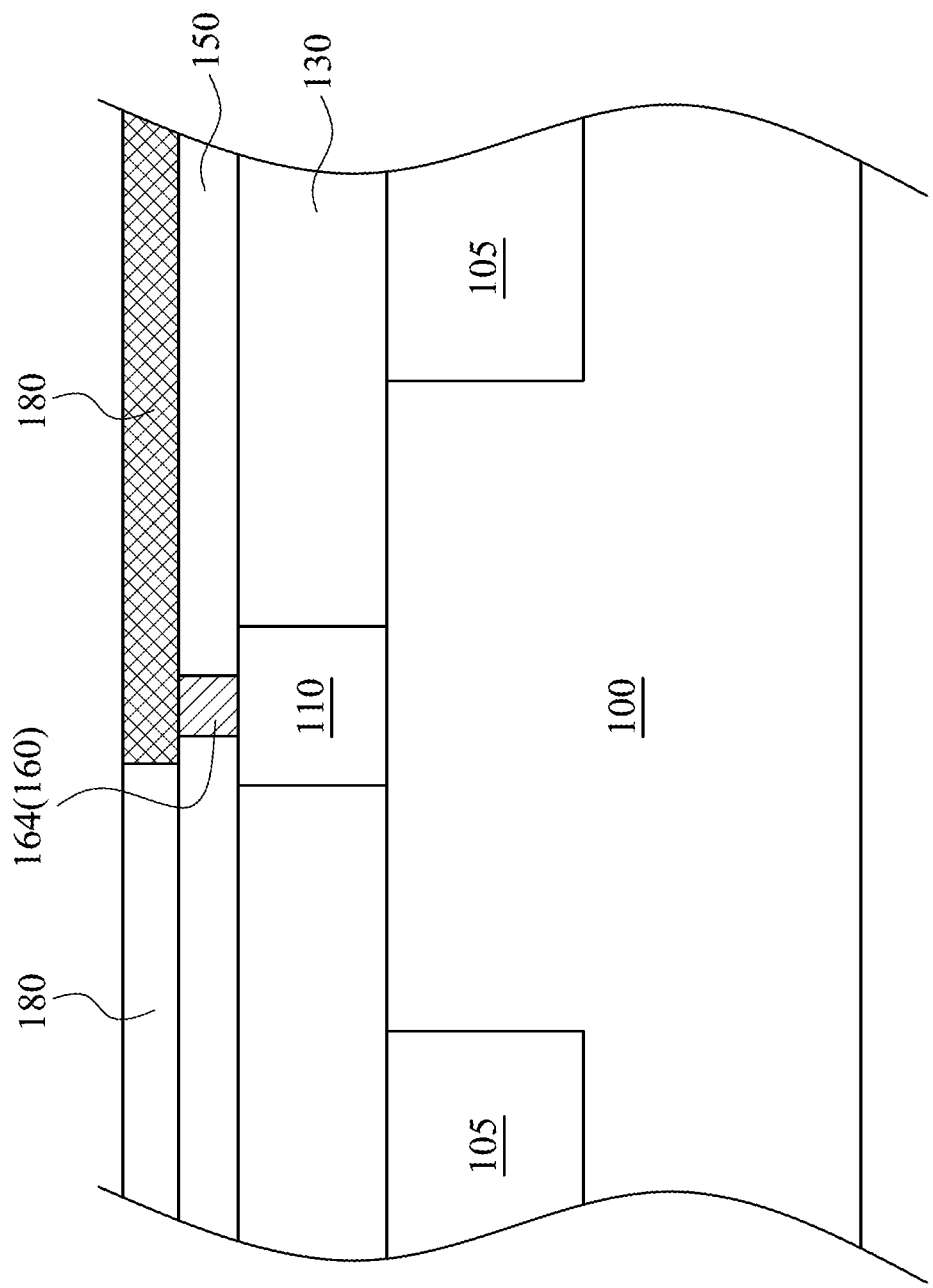
Figure 3D:
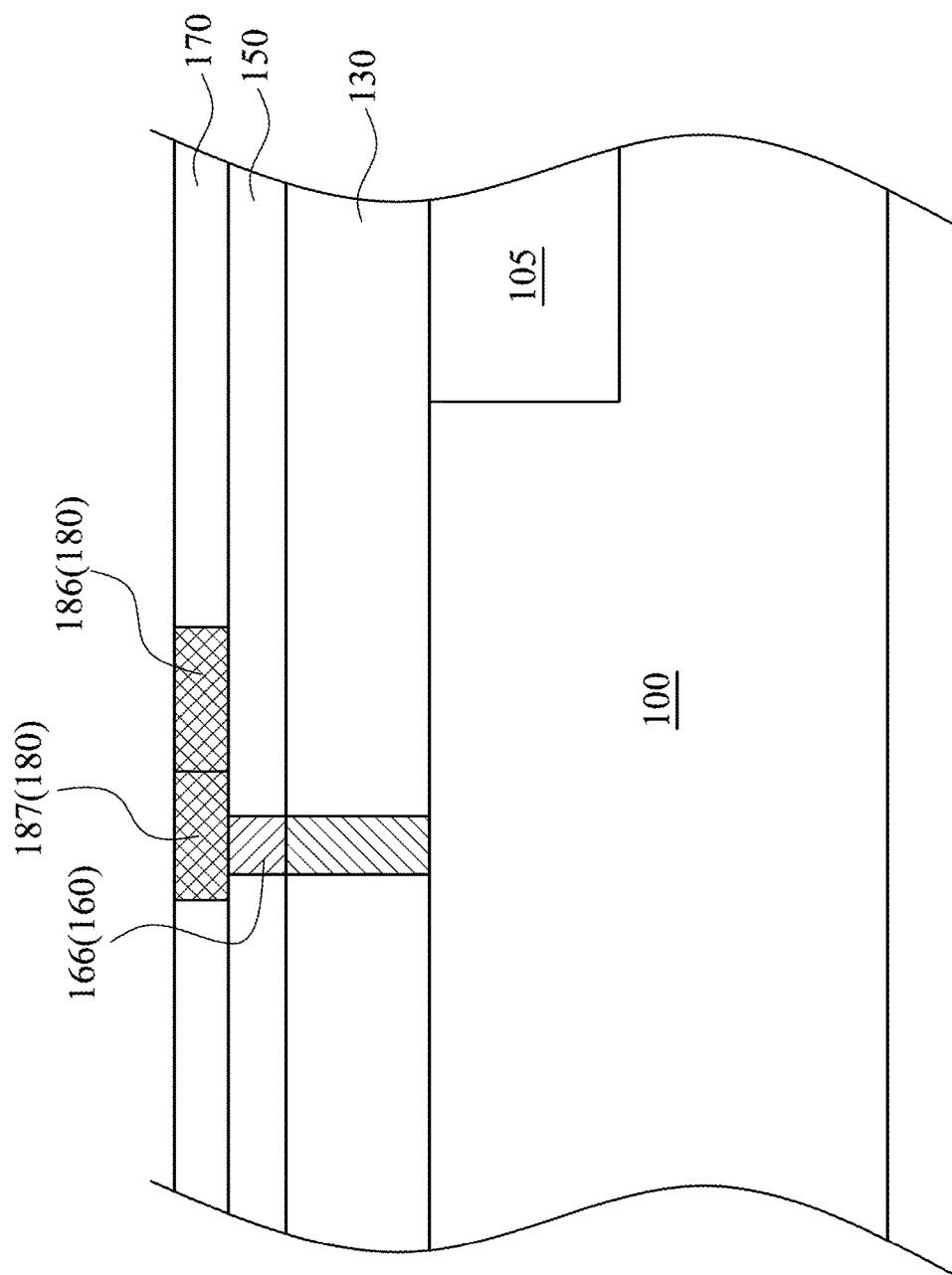

Reference is made to FIGS. 3A to 3D, where FIG. 3A is a top view of a semiconductor structure, FIG. 3B is a cross-sectional view along line B-B of FIG. 3A, FIG. 3C is cross-sectional view along line C-C of FIG. 3A, and FIG. 3D is cross-sectional view along line D-D of FIG. 3A. It is noted that some elements of FIGS. 3B to 3D are not illustrated in FIG. 3A for clarity.

An ILD layer 170 is formed over the ILD layer 150. The material of the ILD layer 170 may be similar to materials of the ILD layers 130 and 150, but the present disclosure is not limited thereto. Then, a conductive structure 180 is formed in the ILD layer 170. In some embodiments, the conductive structure 180 may be formed by patterning the ILD layer 170 to form a plurality of recesses therein that define the pattern of the conductive structure 180, and filling a conductive material into the recesses. Then, a planarization process, such as CMP, is performed to remove excessive conductive material to form the conductive structure 180.

In greater detail, the conductive structure 180 includes conductive pads 182, 184, 186, 187, and 188, where the conductive pads 182 are connected to the conductive vias 162, the conductive pad 184 is connected to the conductive vias 164, and the conductive pad 187 is connected to the conductive vias 166, respectively. The conductive structure 180 further includes a metal line 183 and a metal line 185, where the metal line 183 connects the conductive pad 184 to the conductive pad 188, and the metal line 185 connects the conductive pad 188 to the conductive pad 186.

Reference is made to FIG. 3A. The metal line 183 has a portion (enclosed by dash-line in FIG. 3A) having serpentine pattern. Here, the serpentine pattern is defined as the metal line 183 that runs back and forth, where one end of the metal line 183 is connected to the conductive pad 184, and the other end of the metal line 183 is connected to the conductive pad 188. It is noted that each lines of the serpentine pattern has a width of critical dimension CD, and the adjacent lines of the serpentine pattern are separated from each other by a critical dimension CD (except in the corner).

The present disclosure provides a method to monitor the critical dimension CD. A testing process is applied to monitor the continuity of the metal lines 183 having serpentine pattern. Biases are applied to the conductive pads 182 and 184 to drive the transistor 10, and the current is checked at the conductive pad 188 (or 186). Here, the serpentine pattern of the metal lines 183 is served as a resistor to detect whether a current flows through the serpentine pattern of the metal lines 183.

If the electrical current is detected at pad 188 (or pad 186), it indicates that the metal line 183 is continuous, and the lithographic process is able to reach a width of critical dimension CD of the serpentine pattern. That is, the path way between the pad 184 and the pad 188 (or 186) is electrically connected. However, if the electrical current is not detected at pad 188 (or 186), it indicates that the metal line 183 is not continuous. That is, the path way between the pad 184 and the pad 188 (or 186) is not electrically connected. The metal line 183 is not continuous where the lithographic process is unable to print and/or etch the metal line 183 with a width of critical dimension CD. Thus, the metal line 183 becomes too narrow and breaks somewhere along its path. As a result, by forming a metal layer having serpentine pattern, the critical dimension CD of the width of the serpentine pattern can be determined through the aforementioned method.

In some embodiments, the detected result may be generated by a processor, such as a computer, or may be determined artificially.

The antenna effect is a phenomenon that occurred during the fabrication of integrated circuits. During some semiconductor manufacturing processes, such as plasma etching or CMP, the conductive structure 180 may operates as an antenna, absorbs electrostatic charges during the processes. When the accumulated charges exceed a specified level, through a gate stack 110 of the transistor 10 connected to the above conductive structure 180 and, as a result, the electrostatic charges cause damage to a gate oxide film of the transistor 10. In the case of FIGS. 3A to 3D, an effective segment, due to its connection to the gate stack 110 through the via 164, is defined as the portion of the conductive structure 180 that may cause gate damage. Once the serpentine pattern breaks along its path, the portion of the conductive structure 180 that is in direct contact with the via 164 is referred to as the effective segment that may cause antenna effect. However, other portions of the conductive structure 180 that are separated from the via 164 are not effective segment, since they would not cause gate damage.

As a first result, if the metal line 183 is continuous, it can be served as an antenna act as a safe discharge of electrostatic charge path. In the present embodiments, one end of the metal line 183 is coupled to the gate stack 110 (see FIG. 3B), and the other end of the metal line 183 is coupled to the substrate 100 through the conductive pad 188, the metal line 185, the conductive pads 186 and 187, and the via 166 (see FIGS. 3A and 3D). Stated another way, the metal line 183 is grounded to the substrate 100, and thus the metal line 183 may be served as a safe discharge of electrostatic charge path.

However, as a second result, if the metal line 183 is not continuous, an antenna ratio judging process is performed. In some embodiments, the antenna ratio judging process includes determining the exposed area of the conductive structure 180 that is electrically coupled to the gate stack 110, and determining whether the ratio of the exposed area of the conductive structure 180 coupled to the gate stack 110 to the area of the gate stack 110 is greater than a predetermined value.

In the present embodiment, since the metal line 183 is not continuous, it indicates that the metal line 183 breaks somewhere along its path. However, we are unable to know where the metal line 183 breaks. Therefore, electronic scanning technology, such as Scanning Electron Microscope (SEM) or Transmission Electron Microscope (TEM), may be employed to determine the effective area of the portion of the conductive structure that is coupled to the gate stack 110. In this case, the effective area may include the conductive pad 184 and the portion of the metal line 183 that is connected to the conductive pad 184. In some embodiments, the effective area may be measured by, for example, generating an image of the conductive structure 180 and calculating the area of the portion of the conductive structure 180 that is electrically coupled to the gate stack 110.

It should be appreciated that the antenna ratio judging process may be performed based on antenna rules that may be utilized to identify the probability of antenna effects. In one embodiment, the antenna rules may take into account the ratio of an exposed area that includes the metal pathways to an area of the gate. For example:

$$\text{Predetermined Value} \geq \frac{\text{Metal Area}}{\text{Gate Area}}$$

It is verified that a value on the right side of the equation does not exceed a value on the left side of the equation. If a value of on the right side of the equation exceeds a value on the left side of the equation, it indicates that there is a higher probability to cause antenna effect. On the other hand, if a value of on the right side of the equation is lower than a value on the left side of the equation, it indicates the ratio of the area of the portion of the conductive structure 180 coupled to the gate stack 110 to the area of the gate stack 100 and is within a safe range. In some embodiments, the predetermined value of the equation may also be referred to as an antenna ratio. For example, the antenna ratio may be 40, 200, 400, 1000, 2000, but the present disclosure is not limited thereto.

Figure 4:
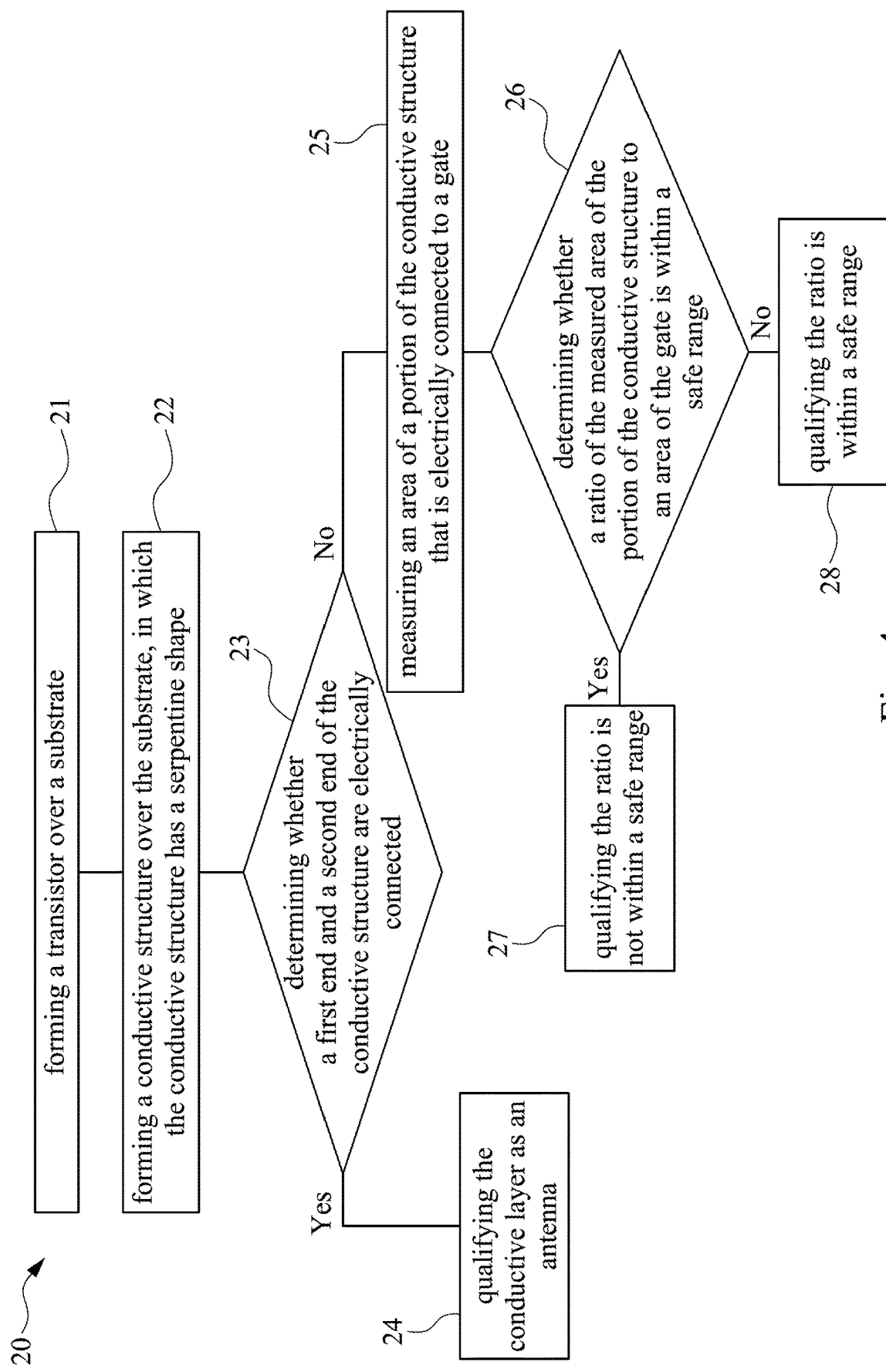
FIG. 4 illustrates a flow chart in accordance with some embodiments of the present disclosure.

FIG. 4 illustrates a method of manufacturing a semiconductor structure. It is noted that some details in the method of FIG. 4 have been described through FIGS. 1A to 3D, and thus some details in this aspect may be omitted for simplicity.

The method 20 begins at operation 21 where a transistor is formed over a substrate. In some embodiments, the transistor is formed within a test element group (TEG) of the substrate. In some embodiments, the transistor includes a gate stack and source/drain structure disposed on opposite sides of the gate stack.

The method 20 proceeds to operation 22 where a conductive structure having a serpentine pattern is formed over the transistor. In some embodiments, one end of the serpentine pattern is coupled to the gate stack of the transistor, and the other end of the serpentine pattern is coupled to the substrate through a via.

The method 20 proceeds to operation 23, detecting whether an electrical current occurs between opposite sides of the serpentine pattern of the conductive structure. Here, biases are supplied to opposite sides of the serpentine pattern to determine whether an electrical current occurs.

If the electrical current is detected at operation 23, the method 20 proceeds to operation 24 where the conductive structure is qualified as an antenna. Once the current is detected at opposite sides of the serpentine pattern, it indicates the serpentine pattern is continuous, and the lithographic process is able to reach a width of critical dimension CD. As a result, if the serpentine pattern of the conductive structure is continuous, it can be served as an antenna act as a safe discharge of electrostatic charge path, since one end of the conductive structure is coupled to the substrate through the via.

If the electrical current is not detected at operation 23, it indicates that the serpentine pattern is not continuous, and the lithographic process is unable to print and/or etch the serpentine pattern with a width of critical dimension CD. Thus, the serpentine pattern becomes too narrow and breaks somewhere along its path. As a result, by forming a metal layer having serpentine pattern, the critical dimension CD can be determined.

Thus, the method 20 proceeds to operation 25 where the area of the conductive structure coupled to the gate stack of the transistor is detected. In some embodiments, the area may be detected by performing electronic scanning technology, such as Scanning Electron Microscope (SEM) or Transmission Electron Microscope (TEM).

Then, based on the measured area, the method 20 proceeds to operation 26 where an antenna ratio judging process is performed to determine whether the ratio of the area of the conductive structure coupled to the gate stack to the area of the gate stack is within a safe range.

Here, the antenna ratio judging process may be performed based on antenna rules that may be utilized to identify the probability of antenna effects. In one embodiment, the antenna rules may take into account the ratio of an exposed area that includes the metal pathways to an area of the gate. For example:

$$\text{Predetermined Value} \geq \frac{\text{Metal Area}}{\text{Gate Area}}$$

It is verified that a value on the right side of the equation does not exceed a value on the left side of the equation. If a value of on the right side of the equation exceeds a value on the left side of the equation, it indicates that there is a higher probability to cause antenna effect. On the other hand, if a value of on the right side of the equation is lower than a value on the left side of the equation, it indicates the ratio of the area of the portion of the conductive structure coupled to the gate stack to the area of the gate stack is within a safe range. In some embodiments, the predetermined value of the equation may also be referred to as an antenna ratio. For example, the antenna ratio may be 40, 200, 400, 1000, 2000, but the present disclosure is not limited thereto. The antenna ratio judging process may be performed by a processor, such as a central processing unit (CPU) in a computer.

Figure 5A:
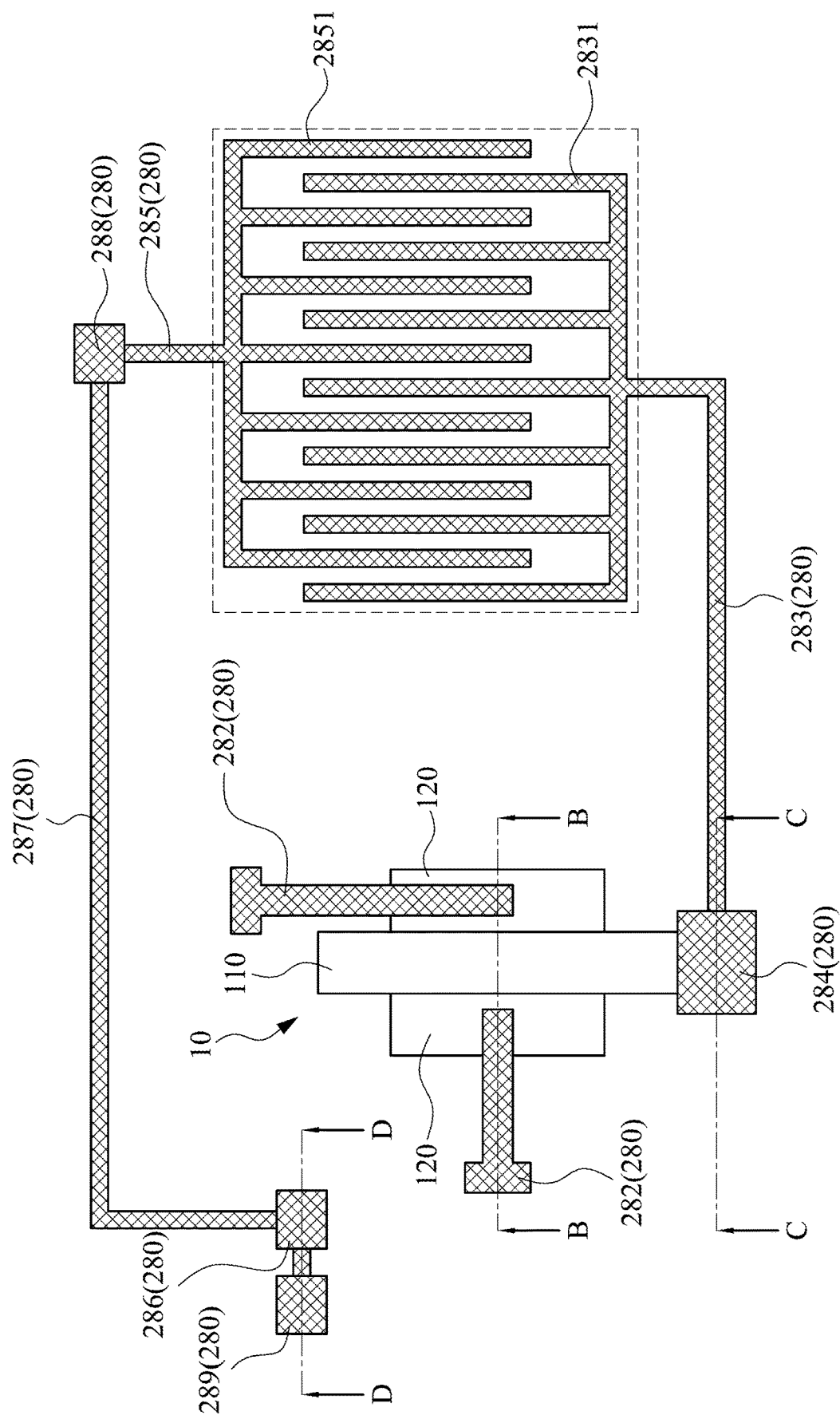
FIGS. 5A to 5D illustrate a semiconductor structure at various stages in accordance with some embodiments of the present disclosure.
Figure 5B:
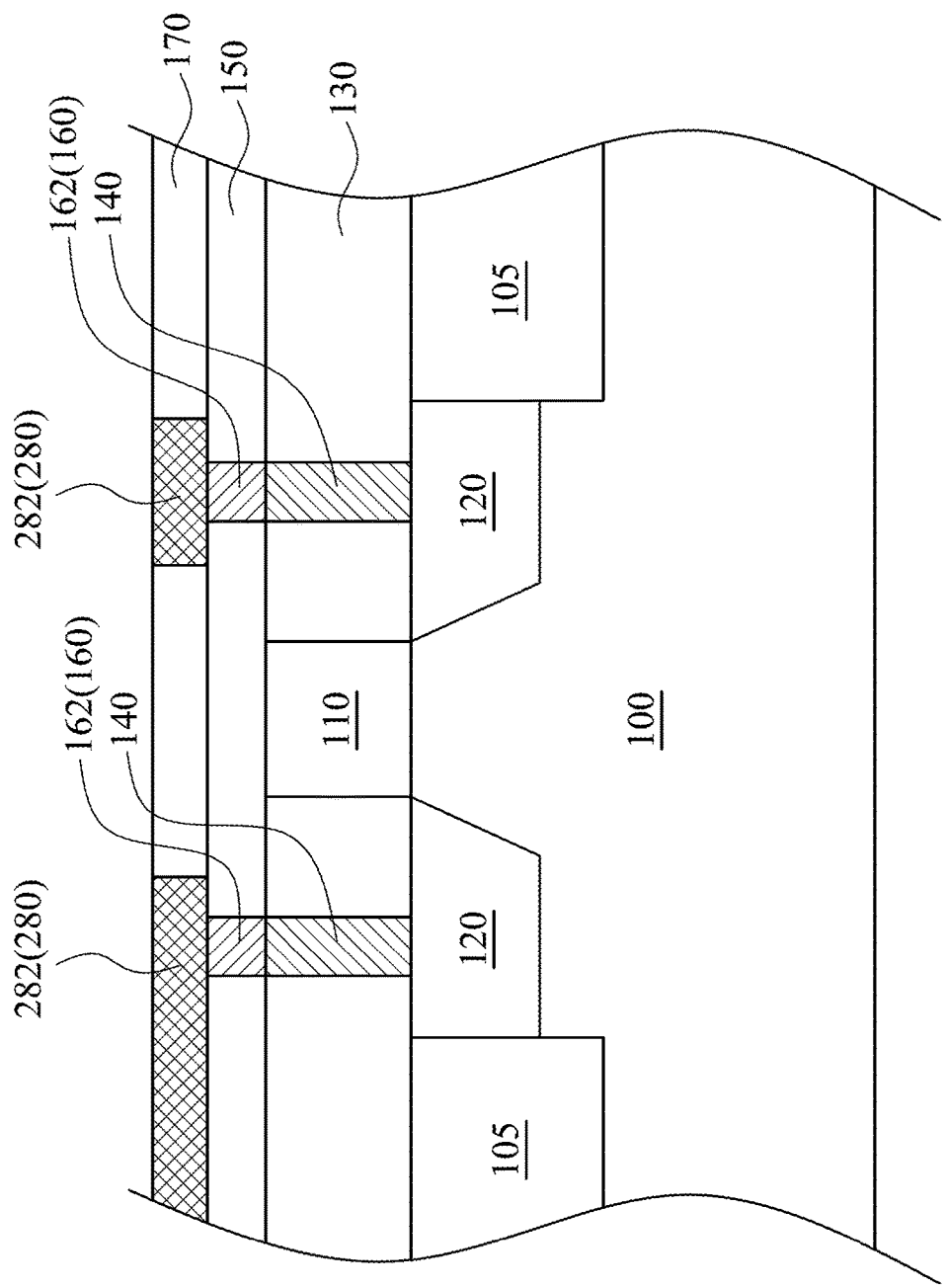
Figure 5C:
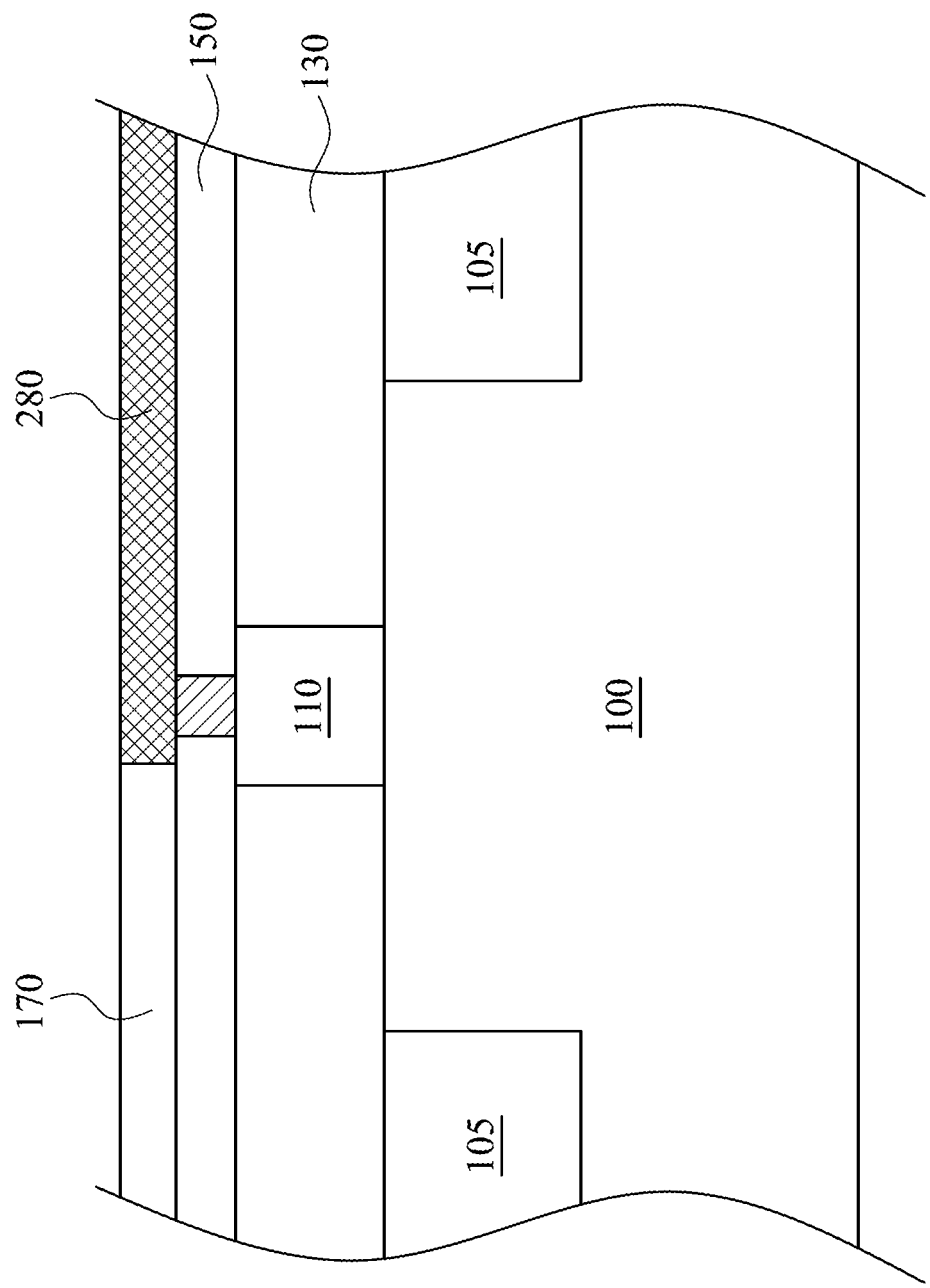
Figure 5D:
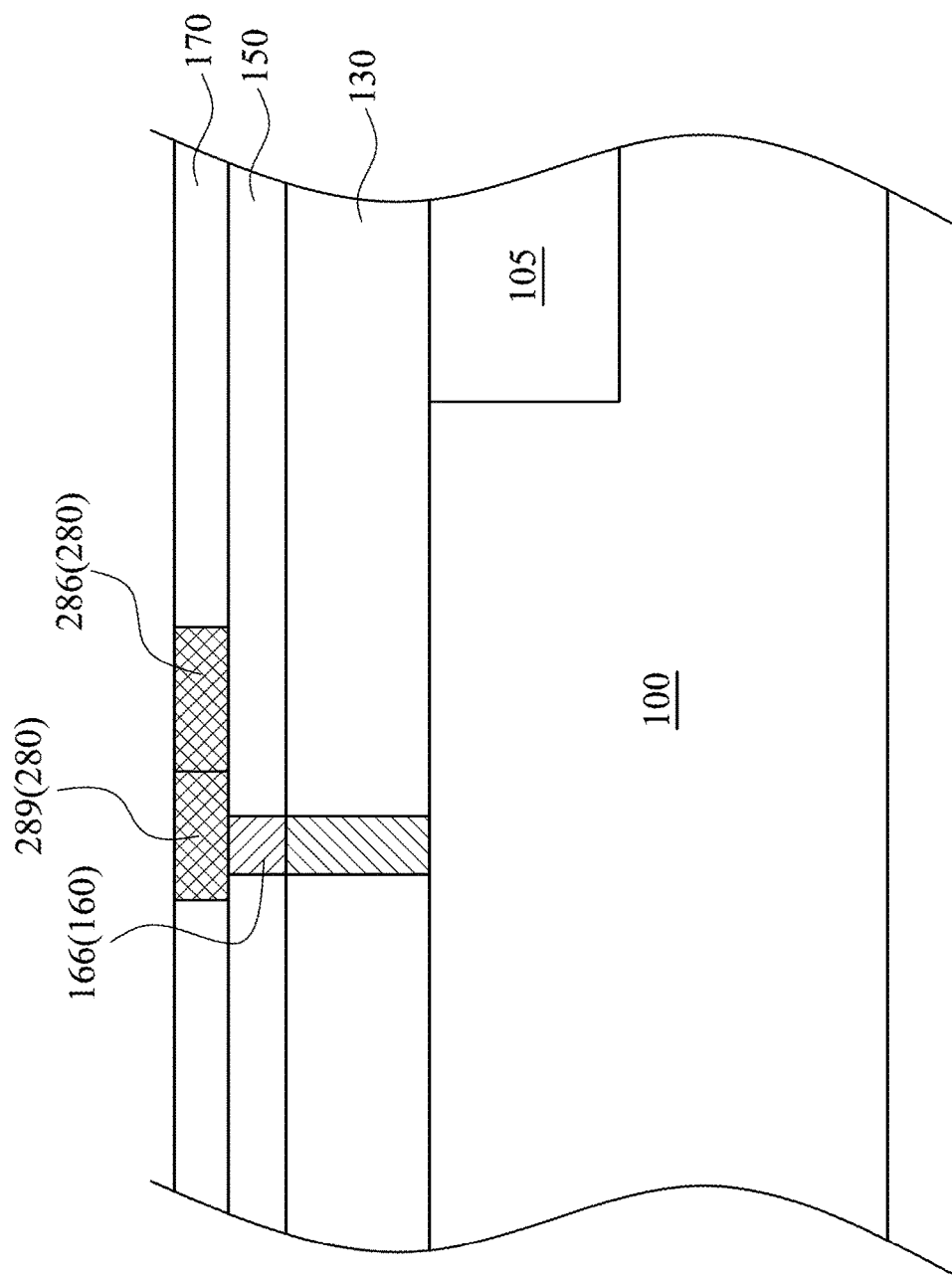

Reference is made to FIGS. 5A to 5D, where FIG. 5A is a top view of a semiconductor structure, FIG. 5B is a cross-sectional view along line B-B of FIG. 5A, FIG. 5C is cross-sectional view along line C-C of FIG. 5A, and FIG. 5D is cross-sectional view along line D-D of FIG. 5A. It is noted that some elements of FIGS. 5B to 5D are not illustrated in FIG. 5A for clarity. Some structural elements in FIGS. 5A to 5D are the same or similar to those described in FIGS. 1A to 3D. Thus, similar descriptions in this aspect will not be repeated hereinafter. Further, similar structures are labeled the same as the structures described in FIGS. 1A to 3D.

FIGS. 5A to 5D are different from FIGS. 3A to 3D, in that the conductive structure 280 of FIGS. 5A and the conductive structure 180 of FIG. 3A have different patterns. The conductive structure 280 includes conductive pads 282, 284, 286, 288, and 289, where the conductive pads 282 are connected to the conductive vias 162, the conductive pad 284 is connected to the conductive vias 164, and the conductive pad 289 is connected to the conductive vias 166, respectively. The conductive structure 280 further includes metal lines 283, 285, and 287, where the metal line 283 is connected to the conductive pad 288, and the metal line 285 is connected to the conductive pad 288, and the metal line 287 connects the conductive pad 286 to the conductive pad 288.

Reference is made to FIG. 5A. The conductive structure 280 has a first portion and a second portion collectively forming a shape of interlocking combs. For example, the metal line 283 has a first comb-shaped portion 2831, and metal line 285 has a second comb-shaped portion 2851 (see region enclosed by dash-line in FIG. 5A). The comb-shaped portions 2831 and 2851 have a number of tines, and the tines of the comb-shaped portion 2831 are coupled in parallel to the tines of the comb-shaped portion 2851. It is noted that the tines of the comb-shaped portions 2831 and 2851 has a width of critical dimension CD, and the tines of the comb-shaped portion 2831 and the tines of the comb-shaped portion 2851 are separated from each other by a critical dimension CD.

The present disclosure provides a method to monitor the critical dimension CD. A testing process is applied to monitor the continuity of the metal lines 283 and 285. Biases are supplied to the conductive pads 282 and 284 to drive the transistor 10, and the current is checked at the conductive pad 288 (or 286). Here, the comb-shaped portions 2831 and 2851 of the metal lines 283 and 285 are served as a resistor to detect whether a current flows through the comb-shaped portions 2831 and 2851 of the metal lines 283 and 285.

If the electrical current is detected at pad 288 (or 286), it indicates that the metal lines 283 and 285 are continuous. That is, the tines of the comb-shaped portion 2831 contact the tines of the comb-shaped portion 2851 at somewhere along their path. Thus, the lithographic process is unable to print and/or etch them with a width of critical dimension CD. That is, tines of the comb-shaped portions 2831 and 2851 become too wide and they touch somewhere along their paths. However, if the electrical current is not detected at pad 288 (or 286), it indicates that the metal lines 283 and 285 are not continuous. That is, the tines of the comb-shaped portion 2831 do not contact the tines of the comb-shaped portion 2851. Thus, the lithographic process is able to print and/or etch the metal lines 283 and 285 with a width of critical dimension CD. As a result, by forming a metal layer having comb patterns, the critical dimension CD can be determined through the aforementioned method.

The antenna effect is a phenomenon that occurred during the fabrication of integrated circuits. During some semiconductor manufacturing processes, such as plasma etching or CMP, the conductive structure 280 may operates as an antenna, absorbs electrostatic charges during the processes. When the accumulated charges exceed a specified level, through a gate stack 110 of the transistor 10 connected to the above conductive structure 280 and, as a result, the electrostatic charges cause damage to a gate oxide film of the transistor 10. In the case of FIGS. 5A to 5D, an effective segment, due to its connection to the gate stack 110 through the via 164, is defined as the portion of the conductive structure 280 that may cause gate damage. The metal line 283 and the pad 284n of the conductive structure 280 that is coupled to the gate stack 110 are referred to as the effective segment that may cause antenna effect. However, other portions of the conductive structure 280 that are separated from the gate stack 110 are not effective segment, since they would not cause gate damage.

As a first result, if the metal lines 283 and 285 are continuous (e.g. in contact with each other), it can be served as an antenna act as a safe discharge of electrostatic charge path. In the present embodiments, one end of the metal line 283 is coupled to the gate stack 110 (see FIG. 5B), and the other end of the metal line 285 is coupled to the substrate 100 through the conductive pad 288, the metal line 287, the conductive pads 286 and 289, and the via 166 (see FIGS. 5A and 5D). Stated another way, the metal lines 283 and 285 are grounded to the substrate 100, and thus the metal lines 283 and 285 may be served as a safe discharge of electrostatic charge path.

However, as a second result, if the metal lines 283 and 285 are not continuous (e.g. separated from each other), an antenna ratio judging process is performed. In some embodiments, the antenna ratio judging process includes determining the exposed area of the conductive structure 280 that is electrically coupled to the gate stack 110, and determining whether the ratio of the exposed area of the conductive structure 280 coupled to the gate stack 110 to the area of the gate stack 110 is greater than a predetermined value. In the present embodiments, metal line 283 and the pad 284 can be referred to as the segment of the conductive structure 280 that is coupled to the gate stack 110.

An electronic scanning technology, such as Scanning Electron Microscope (SEM) or Transmission Electron Microscope (TEM), may be employed to determine the effective area of the portion of the conductive structure 280 that is coupled to the gate stack 110. In this case, the effective area may include the conductive pad 284 and the metal line 283 that is connected to the conductive pad 284. In some embodiments, the effective area may be measured by, for example, generating an image of the conductive structure 280 and calculating the area of the portion of the conductive structure 280 that is electrically coupled to the gate stack 110. In some embodiments, the electronic scanning technology can be omitted, since the area of the conductive pad 284 and the metal line 283 may be predetermined by layout design.

It should be appreciated that the antenna ratio judging process may be performed based on antenna rules that may be utilized to identify the probability of antenna effects. In one embodiment, the antenna rules may take into account the ratio of an exposed area that includes the metal pathways to an area of the gate. For example:

$$\text{Predetermined Value} \geq \frac{\text{Metal Area}}{\text{Gate Area}}$$

It is verified that a value on the right side of the equation does not exceed a value on the left side of the equation. If a value of on the right side of the equation exceeds a value on the left side of the equation, it indicates that there is a higher probability to cause antenna effect. On the other hand, if a value of on the right side of the equation is lower than a value on the left side of the equation, it indicates the ratio of the area of the portion of the conductive structure 280 coupled to the gate stack 110 to the area of the gate stack 100 is within a safe range. In some embodiments, the predetermined value of the equation may also be referred to as an antenna ratio. For example, the antenna ratio may be 40, 200, 400, 1000, 2000, but the present disclosure is not limited thereto.

Figure 6:
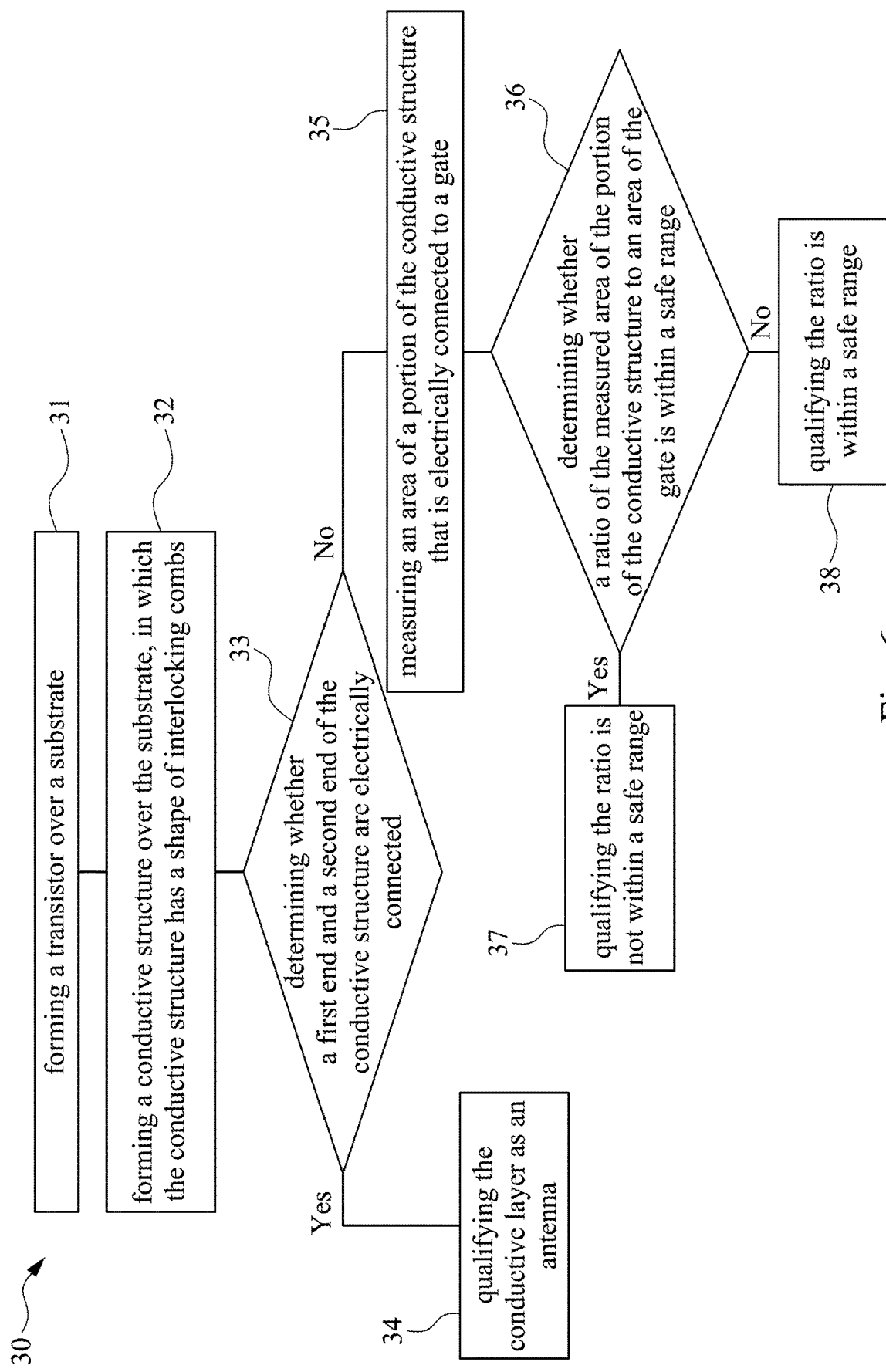
FIG. 6 illustrates a flow chart in accordance with some embodiments of the present disclosure.

FIG. 6 illustrates a method of manufacturing a semiconductor structure. It is noted that some details in the method of FIG. 6 have been described through FIGS. 1A to 3D and 5A to 5D, and thus some details may be omitted for simplicity.

The method 30 begins at operation 31 where a transistor is formed over a substrate. In some embodiments, the transistor is formed on a test element group (TEG) of the substrate. In some embodiments, the transistor includes a gate stack and source/drain structure disposed on opposite sides of the gate stack.

The method 30 proceeds to operation 32 where a conductive structure having two comb patterns is formed over the transistor. In some embodiments, the conductive structure has a first comb and a second comb, where the first comb and the second comb are coupled with each other in an interleaving manner.

The method 30 proceeds to operation 33, detecting whether an electrical current occurs between opposite sides of the two comb patterns of the conductive structure. Here, biases are supplied to opposite sides of the two comb patterns to determine whether an electrical current occurs.

If the electrical current is detected at operation 33, the method 30 proceeds to operation 34 where the conductive structure is qualified as an antenna. Once the current is detected at opposite sides of the comb patterns, it indicates the comb patterns are in contact with each other, and the lithographic process is unable to reach a width of critical dimension CD. As a result, if the comb patterns of the conductive structure are continuous, it can be served as an antenna act as a safe discharge of electrostatic charge path, since one end of the conductive structure is coupled to the substrate through the via.

If the electrical current is not detected at operation 33, it indicates that the comb patterns is not continuous, and the lithographic process is able to print and/or etch the serpentine pattern with a width of critical dimension CD. As a result, by forming a metal layer having serpentine pattern, the critical dimension CD can be determined.

Thus, the method 30 proceeds to operation 35 where the area of the conductive structure coupled to the gate stack of the transistor is detected. In some embodiments, the area may be detected by performing electronic scanning technology, such as Scanning Electron Microscope (SEM) or Transmission Electron Microscope (TEM). In some other embodiments, the area may be detected according to the layout design.

Then, based on the detected area, the method 30 proceeds to operation 36 where an antenna ratio judging process is performed to determine whether the ratio between the area of the conductive structure coupled to the gate stack and the area of the gate stack is within a safe range.

Here, the antenna ratio judging process may be performed based on antenna rules that may be utilized to identify the probability of antenna effects. In one embodiment, the antenna rules may take into account the ratio of an exposed area that includes the metal pathways to an area of the gate. For example:

$$\text{Predetermined Value} \geq \frac{\text{Metal Area}}{\text{Gate Area}}$$

It is verified that a value on the right side of the equation does not exceed a value on the left side of the equation. If a value of on the right side of the equation exceeds a value on the left side of the equation, it indicates that there is a higher probability to cause antenna effect. On the other hand, if a value of on the right side of the equation is lower than a value on the left side of the equation, it indicates the ratio of the area of the portion of the conductive structure 280 coupled to the gate stack 110 to the area of the gate stack 100 is within a safe range. In some embodiments, the predetermined value of the equation may also be referred to as an antenna ratio. For example, the antenna ratio may be 40, 200, 400, 1000, 2000, but the present disclosure is not limited thereto. The antenna ratio judging process may be performed by a processor, such as a computer.

According to the aforementioned embodiments, it can be seen that the present disclosure offers advantages over semiconductor structures. It is understood, however, that other embodiments may offer additional advantages, and not all advantages are necessarily disclosed herein, and that no particular advantage is required for all embodiments. One advantage is that an conductive structure have a serpentine shape or two interleaved comb shapes is formed over and coupled to a transistor, and a current flow is detected on opposite sides of the conductive structure to determine whether the critical dimension CD can be reached. Another advantage is that the conductive structure can be used as an antenna that acts as a safe discharge of electrostatic charge path. Yet another advantage is that the conductive structure can be used to determine whether the ratio of an exposed area of the conductive structure that couples the gate to an area of the gat is within a safe range.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A method, comprising:
    forming a transistor over a substrate;
    forming a conductive structure over the substrate, such that a first end of the conductive structure is electrically coupled to a gate of the transistor, and a second end of the conductive structure is electrically coupled to the substrate;
    applying biases to the gate of the transistor and source/drain structures of the transistor;
    determining whether the first end and the second end of the conductive structure are electrically connected;
    generating, based on the determination, a first result indicating that the first end and the second end of the conductive structure are electrically connected; and
    qualifying the conductive structure as an antenna in response to the first result.

2. The method of claim 1, wherein the transistor and the conductive structure are formed on a test element group (TEG) of the substrate.

3. The method of claim 1, further comprising:
    generating, based on the determination, a second result indicating that the first and the second end of the conductive structure are not electrically connected;
    measuring an area of a portion of the conductive structure that is electrically connected to the gate in response to the second result; and
    determining whether a ratio of the measured area of the portion of the conductive structure to an area of the gate is within a safe range.

4. The method of claim 3, wherein measuring the area of the portion of the conductive structure comprises generating an image of the conductive structure using an electronic scanning technology.

5. The method of claim 1, wherein forming the conductive structure is performed such that the conductive structure has a serpentine shape.

6. The method of claim 1, wherein forming the conductive structure is performed such that the conductive structure has a first portion and a second portion collectively forming a shape of interlocking combs, the first portion is connected to the first end, and the second portion is connected to the second end.

7. The method of claim 1, further comprising:
    forming a via connecting the conductive structure to the substrate.

* * * * *